(12) United States Patent
Pierre

(10) Patent No.: US 10,481,213 B2
(45) Date of Patent: Nov. 19, 2019

(54) METHOD AND DEVICE FOR DETECTING AN OVERCHARGING OF AN ACCUMULATOR OF A BATTERY

(71) Applicant: DCNS, Paris (FR)

(72) Inventor: Nicolas Pierre, Quimper (FR)

(73) Assignee: DCNS, Paris (FR)

( * ) Notice: Subject to any disclaimer, the term of this patent is extended or adjusted under 35 U.S.C. 154(b) by 211 days.

(21) Appl. No.: 15/533,581

(22) PCT Filed: Dec. 8, 2015

(86) PCT No.: PCT/EP2015/079033
§ 371 (c)(1),
(2) Date: Jun. 6, 2017

(87) PCT Pub. No.: WO2016/091910
PCT Pub. Date: Jun. 16, 2016

(65) Prior Publication Data
US 2017/0336478 A1  Nov. 23, 2017

(30) Foreign Application Priority Data

Dec. 8, 2014 (FR) ..................................... 14 02794

(51) Int. Cl.
*G01R 31/387* (2019.01)
*H02J 7/00* (2006.01)

(52) U.S. Cl.
CPC .......... *G01R 31/387* (2019.01); *H02J 7/0016* (2013.01); *H02J 7/0026* (2013.01); *H02J 7/0029* (2013.01); *H02J 2007/0037* (2013.01)

(58) Field of Classification Search
None
See application file for complete search history.

(56) References Cited

U.S. PATENT DOCUMENTS

| | | | |
|---|---|---|---|
| 2011/0025270 A1* | 2/2011 | Nakanishi | H01M 10/441 320/116 |
| 2011/0031926 A1* | 2/2011 | Bhat | H02J 7/0029 320/101 |
| 2011/0298626 A1 | 12/2011 | Fechalos et al. | |
| 2013/0002030 A1* | 1/2013 | Kumagai | H02J 7/0014 307/77 |
| 2013/0140886 A1 | 6/2013 | Bito | |

OTHER PUBLICATIONS

International Search Report, dated Feb. 24, 2016, from corresponding PCT application.
FR Search Report, dated Jul. 24, 2015, from corresponding FR application.

* cited by examiner

*Primary Examiner* — Paresh H Patel
(74) *Attorney, Agent, or Firm* — Young & Thompson

(57) ABSTRACT

Disclosed is an overcharge detection method for detecting an overcharging of an accumulator of a battery including a set of parallel branches each including accumulators disposed in series, wherein the method includes steps of: (i) collecting the measurements of the currents flowing in the branches of the battery; (ii) identifying at least one variation in current in one branch with respect to at least one other branch as a function of the measurements of current collected; (iii) determining a level of state of charge of the branch; and (iv) detecting an overcharging of an accumulator in the branch as a function of at least the variation in current identified and of the level of state of charge determined.

15 Claims, 2 Drawing Sheets

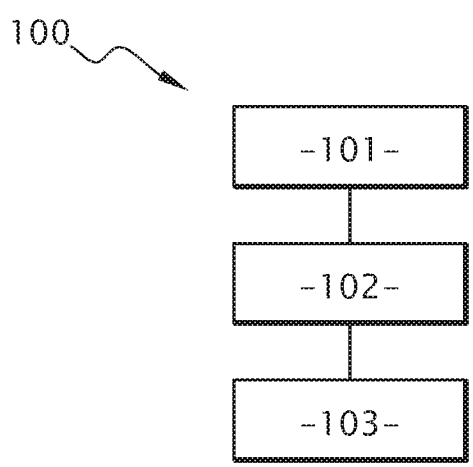

_US 10,481,213 B2_

METHOD AND DEVICE FOR DETECTING AN OVERCHARGING OF AN ACCUMULATOR OF A BATTERY

FIELD OF THE INVENTION

The present invention relates to the detection of an overcharging of an accumulator of a battery comprising a set of parallel branches, each branch comprising accumulators disposed in series.

A charging operation for charging batteries that incorporate such accumulators is carried out by application of a charging voltage to the terminals of the branches of the battery.

BACKGROUND OF THE INVENTION

Some accumulators, in particular those containing Lithium, do not support overcharging. Indeed, a Lithium-ion accumulator that is subjected to overcharging results in a phenomenon referred to as "venting" corresponding to a release of gas (outside the mechanical casing envelope of the accumulator, which can be accompanied by a fine electrolyte mist and lead to degradation (heating, over-pressure, or even explosion).

A charging operation for charging batteries that incorporate such accumulators must thus be accompanied with the monitoring of the battery in order to detect any possible cases of overcharging and to very rapidly stop the charging.

Traditionally, the voltage applied to the terminals of the accumulators is monitored, or even controlled by a system for managing batteries, referred to as BMS (abbreviation for "Battery Management System") that is able to trigger an alarm or a charge cut-off if the voltage of an accumulator becomes too high. However, malfunctions occur in these BMS, due to the large number of electronic components required and thus it is desirable to have available various different monitoring solutions in order to avoid common modes of failures.

Other solutions to prevent occurrence of malfunctions in the batteries, are based on the measurement of currents flowing through the branches, as described for example in the document EP13008739 A2.

However, these solutions in the prior art lead to charge cut-offs or alarms in cases where in reality there are no accumulators that have actually been overcharged.

SUMMARY OF THE INVENTION

To advance the purpose mentioned above, according to a first aspect, the invention proposes an overcharge detection method for detecting an overcharging of an accumulator of a battery comprising a set of parallel branches, each branch comprising accumulators disposed in series, wherein the said method includes the following steps:
  collecting the measurements of the currents flowing through the branches of the battery;
  identifying at least one variation in current in one branch of the said set of branches with respect to at least one other branch of the said set of branches as a function of the measurements of current collected;
  determining a level of state of charge of the said branch; and
  detecting an overcharging of an accumulator in the said branch as a function of at least the said variation in current identified and of the level of state of charge determined.

The present invention makes it possible to limit the cases of erroneous detection of overcharging identified with the solutions in the prior art.

In particular, the present invention makes it possible to distinguish the variations in current between branches due to an overcharging of an accumulator of a branch and variations in current due to the branches of the battery having different storage capacities, thus avoiding the problems, encountered in the prior art, related to inopportune disconnections of such a branch when it does not have any overcharged battery.

In some embodiments, the overcharge detection method for detecting an overcharging of an accumulator of a battery according to the invention additionally also includes one or more of the following characteristic features:
  the detection of an overcharging includes the testing of at least one condition relative to the variation in current identified, the said condition to be tested relative to the variation in current identified being a function of the level of state of charge determined;
  a difference between the current measured in the said branch ($B1, \ldots, BN$) and a reference current determined as a function of at least the current measured in the other branch is calculated;
  the said difference is compared to a threshold value;
  an overcharging of an accumulator in the said branch is detected based on the result of the said comparison and the level of charge determined;
  a first variation in current is identified in the said branch at a first time instant as a function of a first threshold value of current variation, a second variation in current is identified in the said branch at a second time instant as a function of a second current variation threshold value that is distinct from the first current variation threshold value, and an overcharging of an accumulator in the said branch is detected as a function of the said first variation in current, of the said second variation in current and of the level of state of charge determined;
  one can distinguish at least a first range of state of charge levels and a second range, subsequent to the said first range, of state of charge levels, and if a state of charge level of the branch is determined to be in the second range, an overcharging of an accumulator in the said branch is detected if the variation in current identified in the said branch firstly surpasses a first threshold and subsequently surpasses a second threshold, the first and second threshold values having opposite signs;
  the first threshold value is equal to the opposite of the second threshold value;
  an overcharging of an accumulator in the said branch is detected, for a level of charge state determined to be in the first range, as soon as the variation in current identified in the said branch surpasses the first threshold value.

According to a second aspect, the present invention provides a computer program for the detection of an overcharging of an accumulator of a battery comprising a set of parallel branches each including accumulators arranged in series, the said computer program product including the software instructions which, when executed on the computation means, operationally implement the steps of a method according to the first aspect of the invention.

According to a third aspect, the present invention provides an overcharge detection device for detecting an overcharging of an accumulator of a battery comprising a set of parallel branches, each branch comprising accumulators disposed in series, wherein the said device is suitable for and capable of collecting the measurements of the currents flowing through the branches of the battery; of identifying at least one variation in current in one branch of the said set of branches with respect to at least one other branch of the said set of branches as a function of the measurements of current collected; of determining a level of state of charge of the said branch; and of detecting an overcharging of an accumulator in the said branch as a function of at least the said variation in current identified and of the level of state of charge determined.

BRIEF DESCRIPTION OF THE DRAWINGS

These characteristic features and advantages of the invention will become clearly apparent upon reading the description that follows, provided purely by way of example, and with reference being made to the drawings attached, in which:

FIG. 3 is a flowchart of the steps of a method in one embodiment of the invention.

DETAILED DESCRIPTION OF THE INVENTION

Figure 1:
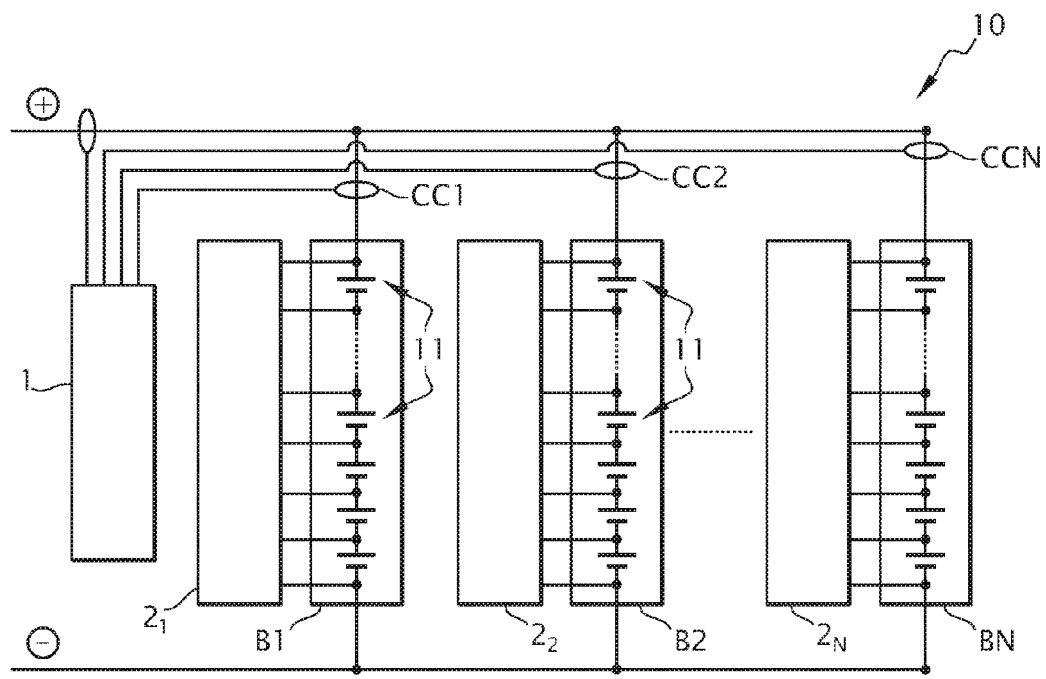
FIG. 1 represents a view of a battery system in one embodiment of the invention.

FIG. 1 is a view of a battery 10 system in one embodiment of the invention.

The battery 10 system includes a battery comprising N packs, also called branches, B1, B2, . . . BN, and disposed in parallel.

N is an integer that is greater than or equal to 2.

The voltage between the positive and negative terminals of the battery is equal to the voltage at the terminals of each branch.

Each branch includes the accumulators 11 connected in series.

For example, the number of accumulators in one branch is equal to M, M is an integer that is greater than or equal to 2.

In a known manner, an accumulator is a basic energy block that is suitable for storing energy.

The battery 10 system includes an overcharging monitoring device 1.

In one embodiment, the battery 10 is a Li-ion type battery and the accumulators are based on LFP (Lithium Iron Phosphate) technology.

The battery 10 is for example intended for ensuring the supply of power for a submarine.

In the embodiment considered, the battery 10 system in addition includes the control devices for controlling the voltage of the accumulators, referenced $2_1$, $2_i$ . . . , $2_N$.

Each control device $2_i$ for controlling the voltage of the accumulators is associated with a respective branch Bi and is adapted for measuring and controlling the voltage at the terminals of each accumulator 11 of the branch Bi, i=1 to N.

For example, the control device $2_i$ for controlling the voltage of the accumulators is suitable for carrying out the balancing of the operating voltages at the terminals of the accumulators arranged in series in the branch Bi so as to ensure that all of the accumulators of the branch Bi conclude their charging in a synchronous manner. Indeed, during the charging, all of the accumulators do not get charged at the same speed on account of disparities in the intrinsic characteristics among the accumulators. The control device $2_i$ for controlling the voltage of the accumulators thus then discharges the accumulators of the branch Bi that are charged to the greatest degree, and progressively therewith the charges of the accumulators in the branch Bi get balanced.

The control device $2_i$ for controlling the voltage of the accumulators additionally is also capable of, when the voltage of an accumulator of the branch Bi reaches the upper limit voltage of the accumulator, triggering a stopping of charging of the branch Bi of the accumulator (in other embodiments, only one stopping of charging of the accumulator is triggered) for example by means of actuation of switches (not represented).

The battery 10 system additionally also includes the current sensors CC1, CC2, . . . , CCN.

The current sensor CCi is adapted for regularly measuring the current flowing in the branch Bi of the battery system 10, i=1 to N.

Figure 2:
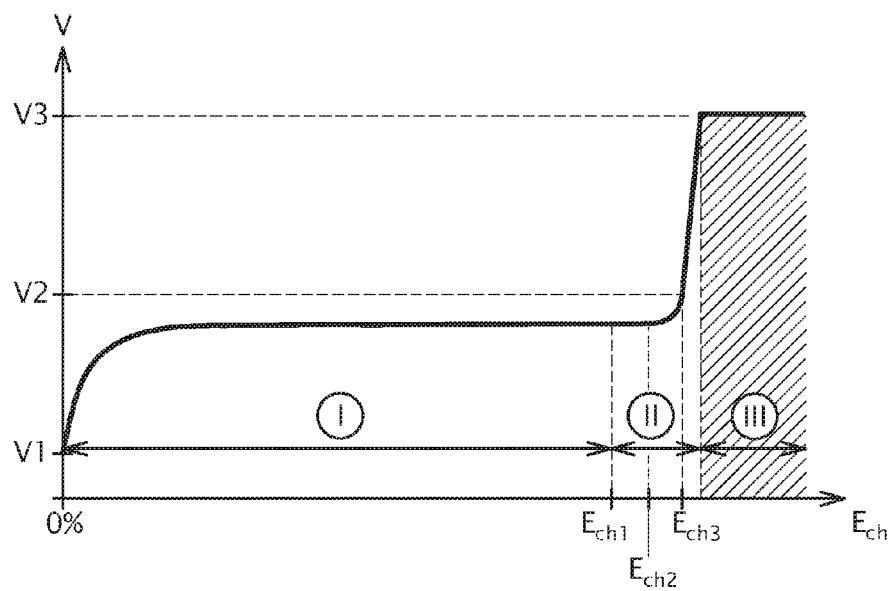
FIG. 2 is a view of a graph representing the evolution of the voltage of an accumulator of a battery as a function of the state of charge of the accumulator in one embodiment of the invention.

FIG. 2 represents the curve of evolution of the voltage V of an accumulator 11 as a function of the state of charge $E_{ch}$ of the accumulator.

The state of charge indicates the amount of energy stored relative to the maximum amount that may be stored by the battery and corresponding to a nominal operating voltage V2 (100% charge state signifies that one has reached the maximum charging voltage of the accumulator as set by the manufacturer which is not to be exceeded under risk of entering a zone of unsafe operation). Physically, when this maximum voltage is reached, for the LFP, this means that all the sites of insertion of the lithium ions have been filled. If this level is surpassed, it begins to cause deterioration of the accumulator and its electrodes).

The state of charge of the accumulator is for example, expressed as a percentage.

The amount of energy, stored or storable, by a battery is for example measured in Watt-hour (Wh) and it corresponds to the capacity of the battery, for example measured in ampere-hour (Ah).

The value V1 represents the minimum operating voltage value of the accumulator, V2 represents the maximum voltage value of the accumulator, and V3 represents the saturation voltage value of the accumulator at the time of the overcharging.

In the case of a Li-ion accumulator based on LFP technology, typically: V1=2.5 V, V2=3.6 V, and V3=5V.

The curve represented in FIG. 2 shows a voltage plateau, a zone in which the slope of the voltage as a function of the state of charge is very low, then the voltage rises in an abrupt fashion over the last 5 percent of charge before reaching the maximum charging voltage V2.

If the charging continues beyond that point, the accumulator reaches saturation at the upper limit voltage V3, the voltage at which it may remain more or less for a long time before beginning "venting", depending upon the charging rate. The lower this rate is the greater will be the time taken by the overcharged accumulator before the phenomenon of "venting" is brought about.

In order for there to be overcharging on an accumulator 11 in series within a branch Bi, this accumulator 11 should be found under the following conditions:
  it is saturated at the voltage V3; and
  it continues to experience a charging current, i.e. the other accumulators arranged in series with it present voltages that are lower than the voltages of the accumulators of the other branches on account of the arranging in parallel of the packs.

It should be noted that if an accumulator 11 in a branch Bi is overcharging, this signifies that the voltage control device $2_i$ for controlling the voltage of the accumulators, in the branch Bi of the accumulator 11, did not function properly and did not carry out the balancing, nor did it trigger the charge stop when the voltage of the accumulator reached the upper limit voltage V3.

In one embodiment of the invention, the space (V, Ech) of the accumulator is subdivided into distinct zones.

Each zone corresponds to a charging phase.

The charging phases are defined by one or more respective ranges of values of charge state.

In this present case, three zones I, II, and III are considered and have been identified for easy reference in FIG. 2:
 the zone I associated with a state of charge of the accumulator comprised between [0, $Ech_1$] corresponds to a start of charging;
 the zone II associated with a state of charge of the accumulator comprised between [$Ech_1$, $Ech_3$] corresponds to an end of charging;
 the zone III associated with a state of charge of the accumulator that is greater than $Ech_3$ corresponds to an over-voltage, and thus eventually over time to an overcharging; in FIG. 2, the overcharging zone, corresponding to the attaining of voltage saturation V3, by the voltage of the accumulator, is indicated by stripes.

In the case of a Li-ion accumulator based on LFP technology, $Ech_1$=90%, $Ech_3$=100%.

In one embodiment, the state of charge of each branch of the battery is also considered, and similar to what has been described here above in reference to the accumulators, the phases of charging of a branch of the battery are defined by one or more respective ranges of the state of charge values.

In the embodiment, three zones ZI, ZII and ZIII are considered:
 the zone ZI associated with a state of charge of a branch comprised between [0, $Ech_1$] corresponds to a start of charging;
 the zone ZII associated with a state of charge of a branch comprised between [$Ech_1$, $Ech_3$] corresponds to an end of charging;
 the zone III associated with a state of charge of a branch, that is greater than $Ech_3$ corresponds to an over-voltage, and thus eventually over time to an overcharging.

In the embodiment considered, the overcharging monitoring device 1 is suitable and capable of operationally implementing the entire set of steps 100 described here below with reference to FIG. 3.

In one embodiment, the overcharging monitoring device 1 comprises a memory storage unit and a microprocessor. The memory storage unit stores the software instructions, which when they are executed by the microprocessor of the overcharging monitoring device 1, effectively carries out the entire set of steps 100.

The entire set of steps 100 is for example reiterated by the overcharging monitoring device 1 at each iteration time instant $T_n=T_0+n/F0$ during the charging of the battery, where $T_0$ is the time instant of start of charging of the battery.

During a step 101, the overcharging monitoring device 1 is suitable for and capable of collecting real-time measurements, performed by the current sensors CCi, i=1 to N, of the currents in the branches Bi and the overcharging monitoring device 1 is additionally also suitable and capable of determining the current state of charge of the battery or of each branch Bi.

During a step 102 the overcharging monitoring device 1 is suitable for and capable of identifying a variation in current in one branch relative to at least one other of these branches as a function of the measurements of current collected during the step 101 and of detecting, as a function of the variation in current identified and the level of state of charge determined (of the battery or of each branch Bi), the presence or the absence of overcharging of an accumulator in the branch Bi.

During a step 103, in the event where a branch $Bi_0$ has been detected as being overcharged during a step 102, the overcharging monitoring device 1 is suitable for and capable of triggering the stop of the charging in the branch $Bi_0$. Such a stop of the charging in the branch $Bi_0$ is triggered for example by emitting an alarm or by actuating the switches (not represented) that disconnect the branch $Bi_0$ from the voltage application terminals for applying the charging voltage of the battery.

In one embodiment, the accumulators are balanced before charging in a manner such that they are in a state of charge assumed to be identical and known, with the evaluation of the state of charge being carried out by means of the current sensors. For example, in a preliminary step, prior to the recharging of the battery, the accumulators 11 of the battery are balanced to a fixed common level of low discharge (for example corresponding to a voltage level V1) by the voltage control device $2_i$ for controlling the voltage of the accumulators. Thus in one embodiment, the overcharging monitoring device 1 is suitable for and capable of determining the current state of charge in the step 101 by taking it to be equal to the state of charge of the battery, calculated by counting the total of the amperes stored by the battery, based on the measurements of current collected since time $T_0$.

Such a method makes it possible to reduce the risk of detecting overcharging instances where there are in fact none.

In one embodiment, the following operations are carried out by the overcharging monitoring device 1 during the step 102 at the iteration time instant $T_n$.

In order to identify a difference in distribution of the current between the branches, the overcharging monitoring device 1 calculates the value of a reference current $\Delta I_{ref\_n}$ that is equal to the sum of the currents currently measured in the N branches divided by the number N of branches.

Then the overcharging monitoring device 1 calculates the difference $\Delta I_{Bi\_n}$ between the measurement of current in the branch Bi currently collected in the step 100, referred to as $I_{Bi\_n}$ and the reference current $I_{ref\_n}$, for i=1 to N, which is:

$$I_{ref\_n} = (\Sigma_{i=1 \text{ à } N} I_{Bi\_n})/N;$$

$$\Delta I_{Bi\_n} = I_{ref\_n} - I_{Bi\_n}.$$

Then the overcharging monitoring device 1 tests the following conditions cond(I) and cond(II) for i=1 to N and thus detects the presence or the absence of an overcharging of an accumulator in a branch:
 cond(I): If the state of charge determined in the step 101 of the iteration time instant $T_n$ is equal to ZI and $\Delta I_{Bi\_n} > \Delta_{threshold}$, then there is thus an overcharged accumulator 11 in the branch Bi.
 cond(II): if, during the charging in the zone ZII, it is detected that the threshold value $\Delta_{threshold}$ has been surpassed, with the level thereafter dropping below the threshold $-\Delta_{threshold}$, then there thus exists an overcharged accumulator 11 in the branch Bi; the implementation of the condition cond(II) is for example as follows: if the state of charge determined in the step 101 of the iteration time instant $T_n$ is equal to ZII, and $\Delta I_{Bi\_n} < -\Delta_{threshold}$, and if it had been determined during the charging in the zone ZII and at a previous time instant, for example referred to as $T_m$ ($T_m<T_n$) that $\Delta I_{Bi\_m}>\Delta_{threshold}$, then there thus exists an overcharged accumulator 11 in the branch Bi.

The threshold value $\Delta_{threshold}$ is a positive value that is fixed experimentally.

It should be noted also that in some embodiments, use may be made of a threshold value $\Delta_{threshold1}$ in order to test the condition cond(I), and a separate and distinct threshold value, $\Delta_{threshold2}$, in order to test the condition cond(II)) the surpassing of this threshold value $\Delta_{threshold2}$ and of its opposite value $-\Delta_{threshold2}$. In one embodiment, separate and distinct values are taken for the positive threshold value $\Delta_{threshold2\_1}$ and the negative threshold value $-\Delta_{threshold2\_2}$ the successive surpassing whereof are detected by the condition cond(II).

If the testing of these conditions cond(I) and cond(II) for each i, i=1 to n, does not result in the detection of overcharging by the overcharging monitoring device 1, the latter forms a conclusion confirming the absence of overcharging within the battery at the time instant $T_n$.

Consider the following case scenarios:

Case A: an accumulator 11 in a branch $Bi_0$ enters into overcharging state in the zone ZI.

In this case, the over-voltage is caused at the level of the branch $Bi_0$ by the accumulator 11 that is overcharged (for example greater than 1.5 V), which presents the illusion to the other branches that the branch $Bi_0$ has a state of charge that is greater than theirs by a certain percentage. Naturally, the current in the branch $Bi_0$ will then decrease and the other branches will get to distribute among themselves an additional current, in total equivalent to the reduction of the current in this branch $Bi_0$. Thus, the other branches compensate for their "lag" over the branch $Bi_0$.

Case B: an accumulator 11 in a branch $Bi_0$ enters into overcharging state in the zone ZII. The branch $Bi_0$ then assumes a lag in its charging because the increase in voltage at its terminals, due to the over-voltage of the accumulator having a fault, does not correspond to a real increase in the state of charge of the branch. Once the voltage of this accumulator reaches the saturation voltage, the branch $Bi_0$ must then make up for the cumulative lag in the state of charge by accepting an increase of current.

Case C: In the zone ZIII, the other branches imposing a maximum voltage on the branch $Bi_0$, the accumulators of the branch $Bi_0$ have a voltage that is high enough to prevent the branch $Bi_0$ from going beyond a voltage where an accumulator can saturate at 5V if the voltage control device $2i_0$ for controlling the voltage of the accumulators did not function properly.

Thus when the state of charge is ZI, the surpassing by $\Delta I_{Bi0\_n}$ of the threshold value $\Delta_{threshold}$ is characteristic of the presence of an accumulator that is overcharging in the branch $Bi_0$, as described in the Case A.

When the state of charge is ZII and the difference between the measurement of the current in the branch $Bi_0$ and the reference current $I_{ref\_n}$, first of all becomes greater than the first threshold value equal to $\Delta_{threshold}$, and then less than the second threshold value equal to $-\Delta_{threshold}$, this means that an accumulator has not been properly balanced and that it is overcharging.

The surpassing of the second threshold value after the first one makes it possible to determine that there has been a malfunction in the voltage management of at least one accumulator. If the detection of overcharging were not to take into account that the surpassing of the first threshold value had been considered, an overcharging could have been reported in an erroneous manner if the branch $Bi_0$ were to be lower overall than the other branches, without this signifying that there is an overcharging of an accumulator in the branch $Bi_0$.

In the event of the battery including one branch having lower capacity than the other branches, there would indeed be in zone ZII a surpassing of $\Delta_{threshold}$, but not the subsequent surpassing of $-\Delta_{threshold}$, thus the present invention will prevent the erroneous detection of overcharging in such a case.

In one embodiment described here above, the condition to be tested relative to a variation in current in one branch Bi includes the calculation of the difference between the measurement of the current in the branch Bi and a reference current equal to the average of the currents flowing in the different branches, then the comparison of this difference with a threshold value. In other embodiments, the condition to be tested relative to a variation in current in one branch Bi takes different forms, for example the reference current is chosen to be equal to a current flowing in another branch.

The present invention therefore provides a solution for detecting problems related to overcharging within a battery and in particular for detecting and remedying malfunctions of the voltage control devices for controlling the voltage of the accumulators of the battery. In one embodiment, the invention thus makes it possible to carry out the detection of overcharging based solely on the measurements of current, and independently of the measurements of voltage of the accumulators.

The invention claimed is:

1. An overcharge detection method for detecting an overcharging of an accumulator of a battery comprising a set of parallel branches, each branch comprising accumulators disposed in series, wherein the said method includes the following steps:
    (i) collecting the measurements of the currents flowing through the branches of the battery;
    (ii) identifying at least one variation in current in one branch of the said set of branches with respect to at least one other branch of the said set of branches as a function of the measurements of current collected;
    (iii) determining a level of state of charge of the said branch; and
    (iv) detecting an overcharging of an accumulator in the said branch as a function of at least the said variation in current identified and of the level of state of charge determined.

2. An overcharge detection method for detecting an overcharging of an accumulator according to claim 1, in which the detection of an overcharging includes the testing of at least one condition relative to the variation in current identified, the said condition to be tested relative to the variation in current identified being a function of the level of state of charge determined.

3. An overcharge detection method for detecting an overcharging of an accumulator according to claim 1, based on which:
    a difference between the current measured in the said branch and a reference current determined as a function of at least the current measured in the other branch is calculated;
    the said difference is compared to a threshold value; and
    an overcharging of an accumulator in the said branch is detected based on the result of the said comparison and the level of state of charge determined.

4. An overcharge detection method for detecting an overcharging of an accumulator according to claim 1, in which a first variation in current is identified in the said branch at a first time instant as a function of a first threshold value of current variation, a second variation in current is identified in the said branch at a second time instant as a function of a second current variation threshold value that is distinct from the first current variation threshold value, and an overcharging of an accumulator in the said branch is detected as a function of the said first variation in current, of the said second variation in current and of the level of state of charge determined.

5. An overcharge detection method for detecting an overcharging of an accumulator according to claim 1, based on which one can distinguish at least a first range of state of charge levels and a second range, subsequent to the said first range, of state of charge levels, and if a state of charge level of the branch is determined to be in the second range, an overcharging of an accumulator in the said branch is detected if the variation in current identified in the said branch firstly surpasses a first threshold and subsequently surpasses a second threshold, the first and second threshold values having opposite signs.

6. An overcharge detection method for detecting an overcharging of an accumulator according to claim 5, the first threshold value being equal to the opposite of the second threshold value.

7. An overcharge detection method for detecting an overcharging of an accumulator according to claim 5, based on which an overcharging of an accumulator in the said branch is detected, for a level of charge state determined to be in the first range, as soon as the variation in current identified in the said branch surpasses the first threshold value.

8. A non-transitory computer readable medium on which is stored a computer program including the software instructions which, when executed by a computer, operationally implement the steps of a method according to claim 1.

9. An overcharge detection device (1) for detecting an overcharging of an accumulator of a battery comprising a set of parallel branches, each branch comprising accumulators disposed in series, wherein the said device is suitable for and capable of collecting the measurements of the currents flowing through the branches of the battery; of identifying at least one variation in current in one branch of the said set of branches with respect to at least one other branch of the said set of branches as a function of the measurements of current collected; of determining a level of state of charge of the said branch; and of detecting an overcharging of an accumulator in the said branch as a function of at least the said variation in current identified and of the level of state of charge determined.

10. An overcharge detection device for detecting an overcharging of an accumulator according to claim 9, suitable for and capable of detecting the said overcharging at least by the testing of at least one condition relative to the variation in current identified, the said condition to be tested relative to the variation in current identified being a function of the level of state of charge determined.

11. An overcharge detection device for detecting an overcharging of an accumulator according to claim 9, suitable for and capable of calculating a difference between the current measured in the said branch and a reference current determined as a function of at least the current measured in the other branch, of comparing the said difference to a threshold value; and of detecting an overcharging of an accumulator in the said branch based on the result of the said comparison and the level of state of charge determined.

12. An overcharge detection device for detecting an overcharging of an accumulator according to claim 9, suitable for and capable of identifying a first variation in current in the said branch at a first time instant as a function of a first threshold value of variation in current, of identifying a second variation in current in the said branch at a second time instant as a function of a second current variation threshold value that is distinct from the first current variation threshold value, and of detecting an overcharging of an accumulator in the said branch as a function of the said first variation in current, of the said second variation in current, and of the level of state of charge determined.

13. An overcharge detection device for detecting an overcharging of an accumulator according to claim 9, suitable for and capable of, a first range of state of charge levels (ZI) and a second range (ZII), subsequent to the said first range, of state of charge levels of the branch, being defined, detecting an overcharging of an accumulator in the said branch if, the level of state of charge of the branch being in the second range, the variation in current identified in the said branch firstly surpasses a first threshold value and subsequently surpasses a second threshold value, the first and second threshold values having opposite signs.

14. An overcharge detection device for detecting an overcharging of an accumulator according to claim 13, in which the first threshold value is equal to the opposite of the second threshold value.

15. An overcharge detection device for detecting an overcharging of an accumulator according to claim 13, suitable for and capable of detecting an overcharging of an accumulator in the said branch as soon as the variation in current identified in the said branch surpasses the first threshold value, for a state of charge level determined in the first range.

* * * * *